United States Patent [19]
Johnson et al.

[11] Patent Number: 5,892,417
[45] Date of Patent: Apr. 6, 1999

[54] SAW DEVICE PACKAGE AND METHOD

[75] Inventors: Gary Carl Johnson, Tempe; Michael J. Anderson, Phoenix; Gregory Jon Kennison, Mesa; Jeffrey Eanes Christensen, Scottsdale; Mark Phillip Popovich, Gilbert, all of Ariz.

[73] Assignee: Motorola Inc., Schaumburg, Ill.

[21] Appl. No.: 775,074

[22] Filed: Dec. 27, 1996

[51] Int. Cl.$^6$ ............ H03H 9/05; H01L 41/053
[52] U.S. Cl. .......... 333/193; 310/313 R; 310/340; 29/25.35; 174/52.2; 174/52.3; 264/272.11; 264/272.16; 361/807; 361/812; 361/813
[58] Field of Search ................ 333/193–196, 333/150; 310/313 R, 313 B, 313 C, 313 D, 340, 344; 29/25.35; 174/52.2, 52.3; 361/807, 812, 813; 156/320, 321, 330; 264/272.11, 272.16

[56] References Cited

U.S. PATENT DOCUMENTS

| 4,699,682 | 10/1987 | Takishima | 156/292 |
| 4,927,580 | 5/1990 | Nasu et al. | 264/272.16 X |
| 4,993,000 | 2/1991 | Niitsuma et al. | 333/194 X |
| 5,164,328 | 11/1992 | Dunn et al. | 437/54 |
| 5,303,457 | 4/1994 | Falkner et al. | 29/25.35 |
| 5,414,214 | 5/1995 | Cho et al. | 174/52.3 |

FOREIGN PATENT DOCUMENTS

| 5-90882 | 4/1993 | Japan | 333/193 |
| 9639632 | of 0000 | WIPO . | |

*Primary Examiner*—Robert J. Pascal
*Assistant Examiner*—Barbara Summons
*Attorney, Agent, or Firm*—Brian M. Mancini; Gary J. Cunningham

[57] ABSTRACT

A method for packaging an acoustic wave filter die, and an acoustic wave filter die packaged by the method. The method includes steps of providing an acoustic wave filter die having an active area disposed on a first surface thereof, providing a leadframe including a die flag and sealing the first surface to the die flag. The method also includes steps of molding a plastic package body about the die and the die flag and singulating the plastic body, the die and the die flag. The molding step desirably includes substeps of placing the acoustic wave filter die sealed to the leadframe in a mold, applying a thermosetting plastic material at a suitable temperature less than the glass transition temperature and at a suitable pressure to the acoustic wave filter die sealed to the leadframe in the mold and maintaining the suitable temperature for a suitable period of time.

18 Claims, 3 Drawing Sheets

SAW DEVICE PACKAGE AND METHOD

FIELD OF THE INVENTION

This invention relates in general to the field of packaging for frequency selection components, in particular to packaging of surface acoustic wave frequency selection components and more particularly to an improved package for surface acoustic wave frequency selection components.

BACKGROUND OF THE INVENTION

Surface acoustic wave (SAW) devices are frequently used in commercial and other applications as RF and IF filters to provide frequency selectivity and other electronic functions. A SAW device depends upon acoustic wave generation. In some cases these acoustic waves are localized to the surface of the substrate. The substrates are piezoelectric materials. Because the acoustic waves in a SAW device often propagate along or very near the surface, SAW devices are generally very sensitive to surface conditions. This sensitivity is not of a chemical or electronic charge nature as it is, for example, in the case of semiconductors, but is of a mechanical nature. For example, foreign material in contact with the surface of a SAW device can change the elastic and inertial properties of the surface thereby altering the attenuation and propagation of acoustic waves moving along on the surface.

Present day SAW devices are typically packaged in hermetic enclosures because of this surface sensitivity. Low cost packaging techniques which are, for example, widely used in connection with semiconductor devices and integrated circuits are not generally used in connection with SAW devices. For example, simple transfer molding of plastic enclosures has not been practicable. In transfer molding, a plastic material in a heated and molten state is forced through channels in a mold to surround the active device die, under pressure, to create a plastic enclosure. This process destroys SAW device performance if it directly coats the surface of the SAW with mold compound.

Nearly all current SAW devices depend upon the use of hermetic packaging techniques for environmental protection because of this problem. Ceramic or metal enclosures with solder or welded seal construction are common. Hermetic packaging is generally costly in terms of both the piece parts required and in the encapsulation processing. As the technology for fabricating SAW die themselves has improved, the packaging costs have become a larger and larger share of the total manufacturing costs. Accordingly, there continues to be a need for improved means and methods for encapsulating SAW devices, especially those which permit one to employ low cost plastic encapsulation techniques.

It is an advantage of the present invention, that SAW devices can be encapsulated in plastic using conventional injection or transfer molding techniques in a manner that preserves the desirable electrical characteristics of encapsulated SAW device.

DETAILED DESCRIPTION OF THE DRAWINGS

As used herein, the term "acoustic wave filter" refers to filters such as Rayleigh wave filters, surface skimming bulk wave filters and other filters employing acoustic eigenmodes.

Figure 1:
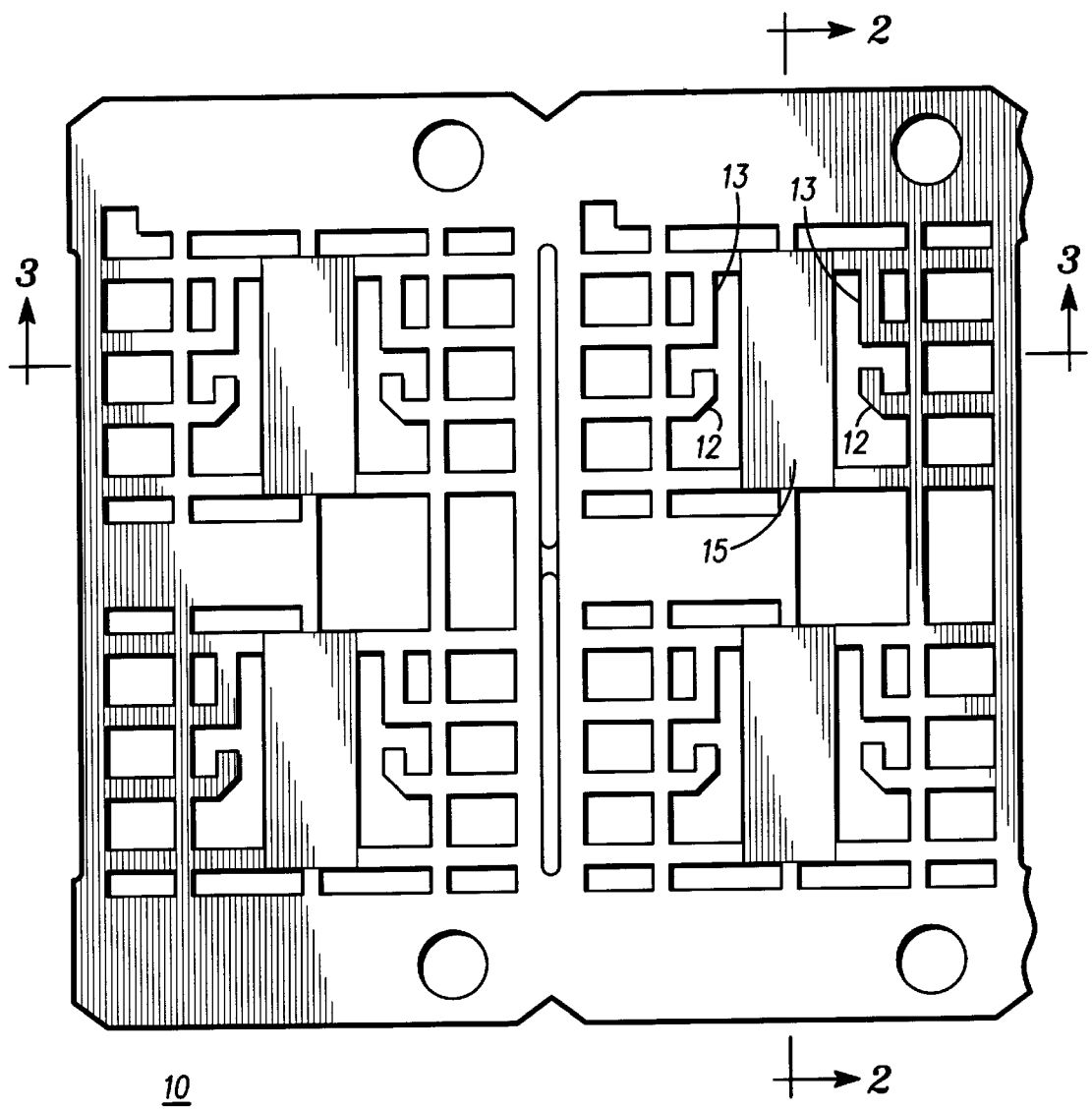
FIG. 1 is a simplified plan view of a custom leadframe for an acoustic wave filter in accordance with the teachings of the present invention.

FIG. 1 is a simplified plan view of custom leadframe 10 for an acoustic wave filter in accordance with the teachings of the present invention. Custom leadframe 10 optionally includes coined die flag 15 and leads 12, 13, all combined into a single piece of metal (usually plated copper) having a total thickness of ca. 200 micrometers (8 mils).

Figure 4:
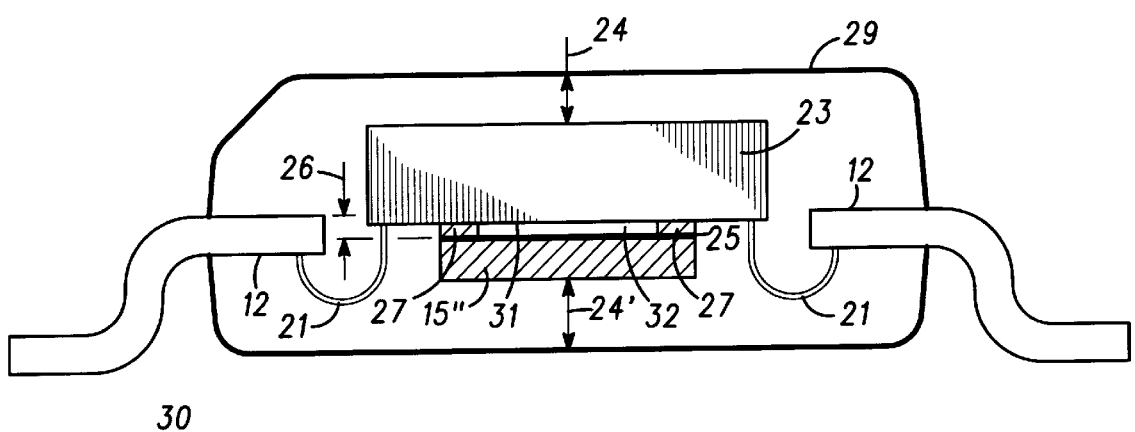
FIG. 4 is a sectional view of a packaged SAW filter in accordance with the teachings of the present invention.
Figure 2:
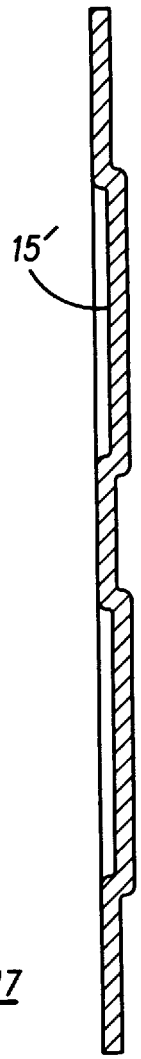
FIG. 2 is a side view, in section, taken along section lines 2—2 of FIG. 1, of the custom leadframe in accordance with the teachings of the present invention.

FIG. 2 is a side view, in section, taken along section lines 2—2 of FIG. 1, of custom leadframe portion 17 in accordance with the teachings of the present invention. Custom leadframe portion 17 usefully includes optional downwardly coined section 15' having offset 26 (FIG. 4). In one example, optional downwardly coined section 15' is ca. 300 micrometers (6 mils) deep. The purpose of the optional downward coining is to displace the flag by about one-half of the thickness of SAW die 23 (FIGS. 4–6, i.e., offset 26) in order to place the combination of SAW die 23 and die flag 15 in about the center of the completed package 29. It is desirable to maintain similar thicknesses 24, 24' of encapsulant 29 (FIG. 4) on either side of SAW die 23/die flag 15 in order to (i) provide environmental protection, (ii) maintain equivalent stresses on either side of SAW die 23 and (iii) to reduce asymmetric effects of thermal expansion and the like. Custom leadframe 10 differs from conventional leadframes intended to mount to the active surface of semiconductor devices in that die flag 15 is included and further in that leads 12, 13 are not intended to be bonded to the die.

Figure 3:
FIG. 3 is a side view, in section, taken along section lines 3—3 of FIG. 1, of the custom leadframe in accordance with the teachings of the present invention.

FIG. 3 is a side view, in section, taken along section lines 3—3 of FIG. 1, of custom leadframe portion 15" in accordance with the teachings of the present invention. Note that no edge of custom leadframe portion 15" is bent.

FIG. 4 is a sectional view of packaged SAW filter 30 in accordance with the teachings of the present invention. Packaged SAW filter 30 includes die flag 15", optional adhesive 25, standoff 27 and SAW die 23, all combined together in a sandwich-like structure that encloses active device surface 31 in sealed cavity 32. Bond wires 21 couple pads 12', 13'(FIG. 5) to leads 12, 13 on leadframe 10. Bond wires 21 usefully comprise Au or Al wires, typically twenty-five to fifty micrometers in thickness. Au wires are desirable because they are (i) chemically inert, (ii) visible on X-ray photographs for defect analysis and (iii) robust during the molding process.

Optional adhesive 25 is employed in processes in which the standoff material 27 is not also the sealant, for example, when standoff 27 comprises photolithographically defined thermoplastic or epoxy-like material.

Applicants have discovered that seal ring 27 (i.e. standoff 27) may be conveniently realized by dispensing and photolithographically shaping photosensitive epoxy on the surface of die 23 prior to dicing. Photosensitive epoxy may be realized as SU-8-75 novolac epoxy available from Shell Chemical Co. of Houston Tex. combined with methyl ethyl ketone (MEK) (or other suitable casting solvent) in proportions such as 75:25 by weight. More or less casting solvent may be employed as desired to achieve a particular film thickness. An onium salt is then added in an amount ranging from 1 to 10 percent by weight to achieve a desired range of sensitivity to ultraviolet light exposure. For example, the mixture previously given might then be mixed to include 90:10 by weight with Cyracure UVI 6074 available from Union Carbide of Danbury Conn. This mixture may be spun on at a speed of 600 rpm to realize a film of thickness of about 20 micrometers. Various thicknesses may be useful; generally thicknesses in a range of one to forty micrometers are of utility with respect to the instant invention. Other onium salts are usefully employed for providing the desired photosensitivity. Examples include Cyracure-6076 and General Electric UVE-1014 or -1016.

After spinning, the layer is cured via a bake at 95° C. for five minutes. Following exposure of regions such as those corresponding to active area 31 to radiation having a wavelength of 365 nm in a dose of 750 to 1250 millijoules per square cm., epoxy may be removed from other areas of die 23 by rinsing in propylene glycol monoethyl acetate for a period of five minutes. A post-exposure bake (laying flat) at 100°–120° C. for ten minutes is then carried out.

Seal ring 27 has several requirements; (i) it must completely surround and enclose active area 31 of die 23, (ii) it must not extend into active area 31 of die 23 to any significant extent, (iii) it must not provide contamination of active area 31 of die 23, for example, by outgassing, (iv) it must allow pads 12', 13' to extend from within active area 31 of die 23 to an area outside seal ring 27 and (v) it, together with optional adhesive layer 25 disposed between seal ring 27 and die flag 15, must bond die flag 15 to die 23 and prevent intrusion of foreign materials during overmolding and at any other time. The latter requirement includes maintaining integrity of seal ring 27 under conditions of 160°–190° C. at a pressure usually in a range of 500–1800 psi (with 1000 psi being typical) for a period of 30 seconds to 3 minutes, with 2 minutes being typical. A sixth requirement of seal ring 27 together with die flag 15 is that (vi) they must separate the surface of die flag 15 from active area 31 of die 23 to a suitable extent (at least a few micrometers).

Figure 5:
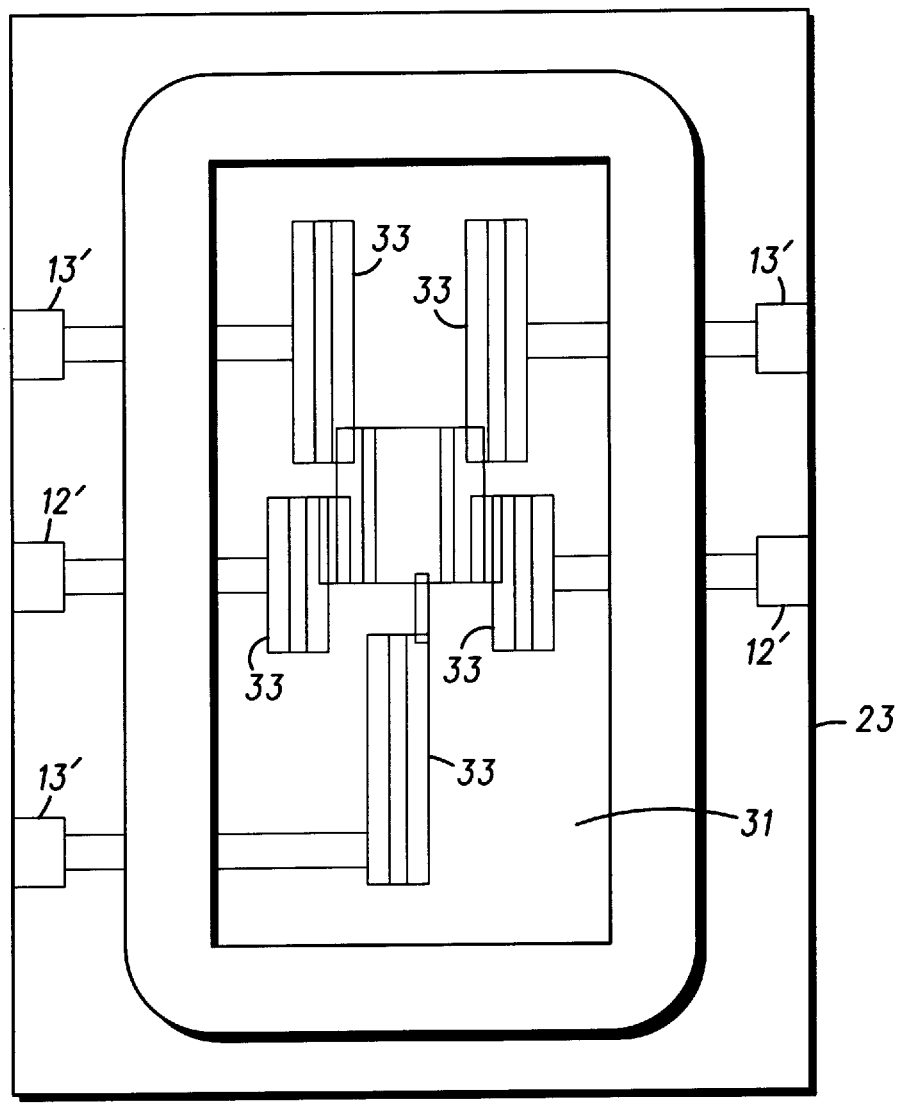
FIG. 5 is a plan view of a SAW filter die in accordance with the teachings of the present invention.

FIG. 5 is a plan view of SAW filter die 23 in accordance with the teachings of the present invention. SAW filter die 23 includes active area 31 on which transducer patterns 33 are disposed. Transducer patterns 33 typically comprise thin (submicron) Al or Al alloy films prepared by vacuum evaporation or sputtering and photolithographically patterned in a fashion similar to that employed for manufacturing microelectronic components such as transistors and integrated circuits. The particular pattern illustrated in FIG. 5 is for a ladder-type filter in which transducers 33 act as resonators, rather than as transmitters or receivers of acoustic energy. Pads 12' correspond to "hot" leads, i.e., input or output, while pads 13' are grounded in normal operation. Active area 31 is illustrated as being surrounded by standoff 27. Materials suitable for acoustic wave filter die 23 include lithium niobate, lithium tantalate, lithium tetraborate and quartz.

Standoff 27 is typically a layer of polyimide such as 33UMB205020 available from Rogers of, among other places, Chandler Ariz. In this part number, the 20's stand for the thickness of thermoplastic polyimide while the 50 corresponds to a thickness for polyimide. This particular thermoplastic has a glass transition temperature of about 265° C. (which is higher than temperatures encountered at processing steps after die attachment), allowing it to be melted onto leadframe 10 and/or die 23 at a higher temperature in a custom LOC (lead on chip) bonder, prior to pressing SAW die 23 thereon to seal die 23 to leadframe 10, however, other temperatures are possible and useful with this or other sealants. Pressing die 23 into sealant 27 (i.e. seal ring/ standoff 27) cools sealant 27, resulting in a bond between die flag 15 and die 23. A list of sealant materials and melting temperatures is included in U.S. Pat. No. 5,303,457, issued to Faulkner, Jr. et al., reproduced at Table I and associated text, which patent is hereby incorporated herein by reference for at least these teachings. Standoffs 27 require that SAW die 23 be increased in area by about 425 micrometers (17 mils) per side in order to include both standoffs 27 and bond pads 12', 13' outside of active area 31, however, smaller or larger areas may be usefully employed.

Standoffs 27 may be any of several such materials, depending on the melting point desired for a particular application. Table 1 provides several illustrative examples of thermoplastic die attachment materials 27 together with the temperatures needed for forming bonds with these examples.

TABLE 1

BONDING TEMPERATURES FOR SEVERAL THERMOPLASTIC MATERIALS

| MATERIAL | BONDING TEMPERATURE (° C.) |
|---|---|
| Polyetheretherketone | 360 |
| Polysulfone | 300–380 |
| Polyethersulfone | 320–380 |
| Polyetherimide | 340–380 |
| Polybutlyeneterepthalate | 240 |
| Polycarbonate | 230–290 |

Encapsulant 29 is usefully Type 6300H epoxy molding compound available from Sumitomo Plastics of Santa Clara Calif. 6300H epoxy is employed in a standard 8 lead SOIC (small outline integrated circuit) process wherein epoxy 29 is transfer molded about portion 35 (FIG. 6) at a pressure of about 70 atmospheres (ca. 1000 pounds per square inch) and a temperature of 175° C., which temperature is chosen to be lower than the glass transition temperature of sealant 27 to avoid melting of sealant 27. The temperature and pressure are maintained for a period of about two minutes. It will be appreciated that other types of standard transfer molded packages (e.g., 14 lead SOIC) are useful in this process.

A further series of examples of how to attach die 23 to die flag 15 is summarized below in Table II. Each of these techniques finds some utility in protecting active area 31.

TABLE II

OPTIONS FOR AFFIXING DIE 23 TO DIE FLAG 15.

| Standoff Material | How Processed | Material information |
|---|---|---|
| Processing Options: | | |
| Polyimide reinforced thermoplastic (solid form) | • Punch standoff 27 onto leadframe 10. | Polyimide reinforced thermoplastic: PN: UMB205020 |
| | • Pick and place die 23. | |
| | • Punch blank onto leadframe 10. | Rogers of Chandler, AZ |
| | • Laser cut or ablate opening | Photodefined standoff: |
| | • Pick and place die | 1. SU-8-75, Shell |

TABLE II-continued

OPTIONS FOR AFFIXING DIE 23 TO DIE FLAG 15.

| Standoff Material | How Processed | Material information |
|---|---|---|
| | 23<br>• Punch blank onto leadframe 10<br>• Pick and place die 23 (w/photodefined standoff 27). | Chemical of Houston TX<br>2. Pyralin PD photodefinable polyimide Dupont, |
| Polyimide reinforced thermoset (solid form) | • Punch standoff 27 onto leadframe 10.<br>• Pick and place die 23.<br>• Punch blank onto leadframe 10.<br>• Laser cut or ablate opening<br>• Pick and place die 23<br>• Punch blank onto leadframe 10<br>• Pick and place die 23 (w/photodefined standoff 27). | Polyimide reinforced thermoplastic:<br>PN: Ableloc 5000 Ablestik, of Rancho Dominguez, CA<br>Photodefined standoff: see above |
| Thermoplastic material (solid form) | • Punch standoff 27 onto leadframe 10.<br>• Pick and place die 23.<br>• Punch blank onto leadframe 10.<br>• Laser cut or ablate opening<br>• Pick and place die 23<br>• Punch blank onto leadframe 10<br>• Pick and place die 23 (w/photodefined standoff 27). | Thermoplastic:<br>PN: Staystik 401, 415 or 482 thermoplastic from Alpha Metals. Culver City, NJ<br>PN: Q3400, Q3500 or Q3600 thermoplastic of DuPont Electronics.<br>Photodefined standoff 27: see above |
| Thermoset material (solid form) | • Punch standoff 27 onto leadframe 10.<br>• Pick and place die 23.<br>• Punch blank onto leadframe 10.<br>• Laser cut or ablate opening<br>• Pick and place die 23.<br>• Punch blank onto leadframe 10<br>• Pick and place die 23 (w/photodefined standoff 27). | Polyimide reinforced thermoplastic:<br>PN: Ablefilm 561K, 5020K Ablestik, of Rancho Dominguez, CA<br>Photodefined standoff: see above |
| Thermoset material (liquid form) | • Screen printed onto wafer 23<br>• B-staged<br>• Dice wafer<br>• Pick and place die 23<br>• Screen printed onto leadframe 10<br>• B-staged<br>• Pick and place die 23<br>• Dispensed onto wafer<br>• B-staged<br>• Dice wafer<br>• Pick and place die 23<br>• Dispensed onto leadframe 10<br>• B-staged<br>• Pick and place die 23<br>• Transfer print onto wafer<br>• B-staged<br>• Pick and place die 23<br>• Transfer print onto wafer<br>• B-Staged<br>• Dice<br>• Pick and place | Thermoset:<br>PN: Ablebond B4-1 epoxy of Ablestik, Rancho Domingo CA |
| Thermoplastic material (liquid form) | • Screen printed onto wafer<br>• Screen printed onto wafer<br>• Drive off solvents<br>• Dice wafer<br>• Pick and place die 23<br>• Screen printed onto leadframe 10<br>• Drive off solvents<br>• Pick and place die 23<br>• Dispensed onto wafer<br>• Drive off solvents<br>• Dice wafer<br>• Pick and place die 23<br>• Dispensed onto leadframe<br>• Drive off solvents<br>• Pick and place die 23<br>• Transfer print onto wafer<br>• Drive off solvents<br>• Pick and place die 23<br>• Transfer print onto wafer<br>• Drive off solvents<br>• Dice<br>• Pick and place | Thermoplastic material:<br>PN: Staystik 301, 383 or 393 from Alpha Metals, Culver City, NJ Culver City, NJ |

Figure 6:
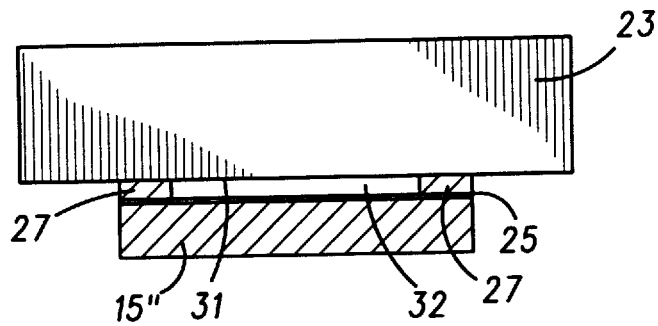
FIG. 6 is an enlarged side view of a portion of the packaged SAW filter of FIG. 4 in accordance with the teachings of the present invention.

FIG. 6 is an enlarged side view of portion 35 of packaged SAW filter 30 of FIG. 4 in accordance with the teachings of the present invention. Portion 35 may be shipped readily because active surface 31 is sealed, thereby protecting it from surface damage, by the combination of sealant 27 and die flag 15.

Packaged devices are then singulated, that is, cut free from outer edges of custom lead frame 10 to provide individual packaged devices with electrically separated leads 12, 13. Electrical and other tests are performed and the packaged, tested components are then ready for shipping or assembly into electronic apparatus.

Applicants have discovered that standoffs 27 are usefully machined to shape by either of two methods: (i) laser ablation using a $CO_2$ Impact laser (e.g., pulsed transversely excited atmospheric $CO_2$ laser having a 10.6 micrometer wavelength) or (ii) a mechanical punch or a two stage mechanical punch. $CO_2$ Impact lasers are available from Lumonics of Kanata (near Ottawa), Canada and are preferred because other types of lasers (YAG etc.) tend to leave a charred residue that is conductive and that interferes with normal device operation at the frequencies of interest. Other types of lasers that could be usefully employed include pulsed excimer lasers such as KrF gas lasers having a wavelength of 193 nanometers. A series of options for a simple mechanical punch are summarized in Table II infra. The two stage punch operates by first removing the central portion from standoffs 27 whilst still in tape form. The second stage is effected via a larger punch which both separates standoff 27 from the tape and carries standoff 27 up to die flag 15 when die flag 15 is in the LOC bonder, depositing standoff 27 thereon.

Applicants have further discovered that when packaged SAW die 23 are fashioned from 64° rotated $LiNbO_3$, it is necessary to short all of leads 12, 13 together in temperature shock testing of the finished component. This testing typically comprises repeated temperature cycling between 85° C. and −40° C., resulting in electrical disturbance via the combined effects of pyro- and piezoelectricity. These electrical disturbances are sufficient to "zap" or melt electrodes in transducers 33, resulting in irreversible and catastrophic device failure that is obviated when the leads are all coupled together electrically. Proper selection of mold compounds for matching of thermal coefficients of expansion to those of the substrate material or of a suitable average of the thermal coefficients of expansion for anisotropic substrata may obviate need for this step.

Thus, a SAW filter package and method have been described which overcomes specific problems and accomplishes certain advantages relative to prior art methods and mechanisms. The improvements over known technology are significant. The expense, complexities, and high labor content of prior art hermetic packages are avoided. Similarly, the benefits of moisture and shock resistance have been maintained, while savings in volume and weight of the completed filter have been achieved.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

We claim:

1. A method for packaging an acoustic wave filter die, said method comprising steps of:
    providing an acoustic wave filter die having an active area disposed on a first surface thereof;
    providing a leadframe including a die flag with a substantially flat sealing surface;
    providing a sealing material, and
    sealing said first surface of said die to said die flag with said sealing material such that said active area is sealed in a cavity between said die and said die flag by said sealing material, a height of the cavity defined solely by a height of the sealing material.

2. A method as claimed in claim 1, wherein the providing a sealing material step includes providing a polyimide-reinforced thermoplastic material, and wherein said sealing step includes steps of:
    disposing a ring of said polyimide-reinforced thermoplastic material on said die flag;
    heating said polyimide-reinforced thermoplastic to a temperature above a glass transition temperature of said ring; and
    applying said first surface to said polyimide-reinforced thermoplastic to provide a sealed cavity within which said active area is sealed.

3. A method as claimed in claim 1, wherein the providing a sealing material step includes providing a thermoplastic material, and wherein said sealing step includes steps of:
    heating said thermoplastic material to a temperature above a glass transition temperature of said thermoplastic material;
    disposing said thermoplastic material on said die flag; and
    applying said first surface to said thermoplastic material.

4. A method as claimed in claim 1, further comprising steps of:
    molding a plastic package body about said die and said die flag; and
    singulating said plastic body, said die and said die flag.

5. A method as claimed in claim 4, wherein said providing a leadframe step includes displacing the die flag by about one-half of the thickness of filter die, and wherein said molding step includes steps of:
    placing said acoustic wave filter die sealed to said leadframe in a mold;
    applying a thermosetting plastic material at a suitable temperature less than a glass transition temperature of said thermosetting plastic material and at a suitable pressure to said acoustic wave filter die sealed to said leadframe in said mold such that said filter die sealed to said leadframe is about in the center of said thermosetting plastic material; and
    maintaining said suitable temperature for a suitable period of time.

6. A method as claimed in claim 4, wherein said molding step includes steps of:
    placing said acoustic wave filter die sealed to said leadframe in a mold;
    applying an epoxy at a temperature of about one hundred seventy five degrees Celsius and at a pressure of about a thousand pounds per square inch to said acoustic wave filter die sealed to said leadframe in said mold; and
    maintaining said second temperature for about two minutes.

7. An acoustic wave filter comprising:
    an acoustic wave filter die having an active area disposed on a first surface thereof;
    a leadframe including a die flag with a substantially flat sealing surface; and
    a seal, said first surface of said die sealed to said die flag by said seal, the first surface, seal and sealing surface defining a cavity, a height of the cavity defined solely by a height of the sealing material.

8. An acoustic wave filter as claimed in claim 7, further comprising:
    a plastic package body molded about said die and said die flag; and wherein
    said plastic body, said die and said die flag have been singulated.

9. An acoustic wave filter as claimed in claim 8, wherein said plastic package body includes a thermosetting plastic material.

10. An acoustic wave filter as claimed in claim 8, wherein said plastic package body includes an epoxy.

11. An acoustic wave filter as claimed in claim 7, wherein said seal includes:

a B-staged epoxy material disposed on said die flag, said B-staged epoxy material having been heated to a temperature near the glass transition temperature of said B-staged epoxy material; and wherein said first surface is joined to said B-staged epoxy material.

12. An acoustic wave filter as claimed in claim 7, wherein said seal includes a ring of polyimide-reinforced thermoplastic disposed on said die flag, wherein said polyimide-reinforced thermoplastic has been heated to a temperature near a glass transition temperature of said polyimide-reinforced thermoplastic and said first surface has been applied to said polyimide-reinforced thermoplastic to provide a sealed cavity within which said active area is sealed.

13. A method for packaging an acoustic wave filter die, and an acoustic wave filter die packaged by said method, said method comprising steps of:

providing an acoustic wave filter die having an active area disposed on a first surface thereof;

providing a leadframe including a die flag with a substantially flat sealing surface, the die flag being displaced by about one-half of the thickness of the filter die;

providing a thermoplastic material;

sealing said first surface of said die to said die flag with said thermoplastic material; wherein said sealing step includes substeps of:

disposing said thermoplastic material on said die flag;

heating said thermoplastic material to a temperature near the glass transition temperature of said thermoplastic material; and applying said first surface to said thermoplastic material to form a cavity, a height of the cavity defined by a height of the sealing material; said method further including steps of:

molding a plastic package body about said die and said die flag; and singulating said plastic body, said die and said die flag; wherein said molding step includes substeps of:

placing said acoustic wave filter die sealed to said leadframe in a mold;

applying a thermosetting plastic material at a suitable temperature less than a glass transition temperature of said thermosetting plastic material and at a suitable pressure to said acoustic wave filter die sealed to said leadframe in said mold such that said filter die sealed to said leadframe is about in the center of said thermosetting plastic material; and maintaining said suitable temperature for a suitable period of time.

14. An acoustic wave filter comprising:

an acoustic wave filter die having an active area disposed on a first surface thereof;

a leadframe including a die flag with a substantially flat sealing surface, the die flag being displaced by about one-half of the thickness of the filter die;

a seal, said first surface of said die sealed to said die flag by said seal, the first surface, seal and sealing surface defining a cavity, a height of the cavity defined by a height of the sealing material, said seal and die flag enclosing said active area in said sealed cavity; and a plastic package body molded about said die and said die flag such that said die and said die flag are about in the center of said plastic package body, said plastic package body including electrical leads extending from outside of said plastic package body to contacts disposed on said acoustic wave filter die.

15. An acoustic wave filter as claimed in claim 14, wherein said plastic package body includes an epoxy package body, said seal comprises a material chosen from a group consisting of polyimide, polyetheretherketone, polysulfone, polyethersulfone, polyetherimide, polybutlyeneterepthalate and polycarbonate and said acoustic wave filter die includes a die made from a material chosen from a group consisting of lithium niobate, lithium tantalate, lithium tetraborate and quartz.

16. An acoustic wave filter as claimed in claim 14, wherein said seal comprises a material chosen from a group consisting of polyimide, polyetheretherketone, polysulfone, polyethersulfone, polyetherimide, polybutlyeneterepthalate, polycarbonate, thermoset epoxy, polyimide-reinforced thermoset epoxy and polyimide-reinforced thermoplastic.

17. An acoustic wave filter as claimed in claim 14, wherein said plastic package body includes a plastic package body formed from a thermosetting plastic.

18. An acoustic wave filter as claimed in claim 14, wherein said plastic package body includes an epoxy package body.

* * * * *